US012795874B2

(12) United States Patent
Nishikimi et al.

(10) Patent No.: US 12,795,874 B2
(45) Date of Patent: Nov. 10, 2026

(54) POWER CONVERSION DEVICE

(71) Applicant: HITACHI ASTEMO, LTD., Hitachinaka (JP)

(72) Inventors: Fusanori Nishikimi, Hitachinaka (JP); Takashi Hirao, Hitachinaka (JP); Keigo Saruwatari, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 297 days.

(21) Appl. No.: 18/563,051

(22) PCT Filed: Jul. 15, 2021

(86) PCT No.: PCT/JP2021/026704
§ 371 (c)(1),
(2) Date: Nov. 21, 2023

(87) PCT Pub. No.: WO2023/286257
PCT Pub. Date: Jan. 19, 2023

(65) Prior Publication Data

US 2024/0268086 A1 Aug. 8, 2024

(51) Int. Cl.
*H05K 7/20* (2006.01)
*H02M 7/00* (2006.01)
(Continued)

(52) U.S. Cl.
CPC ............ *H05K 7/209* (2013.01); *H02M 7/003* (2013.01); *H02M 1/08* (2013.01); *H05K 1/181* (2013.01); *H05K 2201/10166* (2013.01)

(58) Field of Classification Search
None
See application file for complete search history.

(56) References Cited

U.S. PATENT DOCUMENTS 10,660,229 B2 * 5/2020 Umeda ............... H02M 3/1584
2003/0168432 A1 * 9/2003 Onizuka ................ H05K 7/026 218/7
(Continued)

FOREIGN PATENT DOCUMENTS

JP 2006-332291 A 12/2006
JP 2008-125240 A 5/2008
(Continued)

OTHER PUBLICATIONS

International Search Report with English Translation and Written Opinion of International Patent Application No. PCT/JP2021/026704 dated Sep. 14, 2021 (8 pages).

*Primary Examiner* — Courtney L Smith
(74) *Attorney, Agent, or Firm* — Foley & Lardner LLP

(57) ABSTRACT

A power conversion device includes: a semiconductor module in which a semiconductor element is sealed; a circuit board on which a drive circuit that drives the semiconductor element via a control terminal of the semiconductor element derived from the semiconductor module is mounted; a first cooling member that is disposed between the semiconductor module and the circuit board and cools the semiconductor module; and a relay terminal that connects the control terminal and the drive circuit. The relay terminal is fixed to a relay member disposed between the semiconductor module and the circuit board.

7 Claims, 15 Drawing Sheets

(51) Int. Cl.
*H02M 1/08* (2006.01)
*H05K 1/181* (2026.01)

(56) References Cited

U.S. PATENT DOCUMENTS

| | | | | |
|---|---|---|---|---|
| 2008/0112201 | A1 | 5/2008 | Yahata et al. | |
| 2016/0157351 | A1* | 6/2016 | Taya | H01L 25/165 361/752 |
| 2017/0162466 | A1 | 6/2017 | Sawada | |
| 2024/0007016 | A1* | 1/2024 | Fujita | H02M 7/003 |

FOREIGN PATENT DOCUMENTS

| | | | |
|---|---|---|---|
| JP | 2017-103380 | A | 6/2017 |
| WO | WO-2010/150471 | A1 | 12/2010 |

* cited by examiner (B)

(A)

(B)

(A)

(A) (B)

(B)

(A)

POWER CONVERSION DEVICE

TECHNICAL FIELD

The present invention relates to a power conversion device.

BACKGROUND ART

A power conversion device using a semiconductor module in which a semiconductor element is sealed has high conversion efficiency, and thus is widely used for consumer use, in-vehicle use, railway use, transformation equipment, and the like. Since this semiconductor element generates heat by energization, it is necessary to cool the semiconductor module. Therefore, in the power conversion device, a cooling member for cooling the semiconductor module is provided in the vicinity of the semiconductor module. In addition, the power conversion device needs to be provided with a circuit board on which a drive circuit that drives a semiconductor element is mounted. In this case, when the signal wiring between the semiconductor module and the circuit board becomes long with the cooling member interposed therebetween, it is necessary to consider assemblability at the time of connection between the semiconductor module and the circuit board, durability against vibration, thermal change, and the like in a severe use environment of the power conversion device, and the like.

PTL 1 describes a power drive unit including three power modules, a plurality of signal terminals led out from the power modules in a direction orthogonal to an array surface of the three power modules, and a control circuit board disposed at a position overlapping the array of the power modules, in which one relay connector is interposed between the power modules and the control circuit board.

CITATION LIST

Patent Literature

PTL 1: JP 2006-332291 A

SUMMARY OF INVENTION

Technical Problem

In PTL 1, a configuration in which a cooling member is interposed is not considered, and there is a problem in assemblability and durability when a signal wiring between a power module and a control circuit board becomes long.

Solution to Problem

A power conversion device according to the present invention includes: a semiconductor module in which a semiconductor element is sealed; a circuit board on which a drive circuit that drives the semiconductor element via a control terminal of the semiconductor element derived from the semiconductor module is mounted; a first cooling member that is disposed between the semiconductor module and the circuit board and cools the semiconductor module; and a relay terminal that connects the control terminal and the drive circuit. The relay terminal is fixed to a relay member disposed between the semiconductor module and the circuit board.

Advantageous Effects of Invention

According to the present invention, assemblability and durability of the power conversion device are improved.

DESCRIPTION OF EMBODIMENTS

Figure 1:
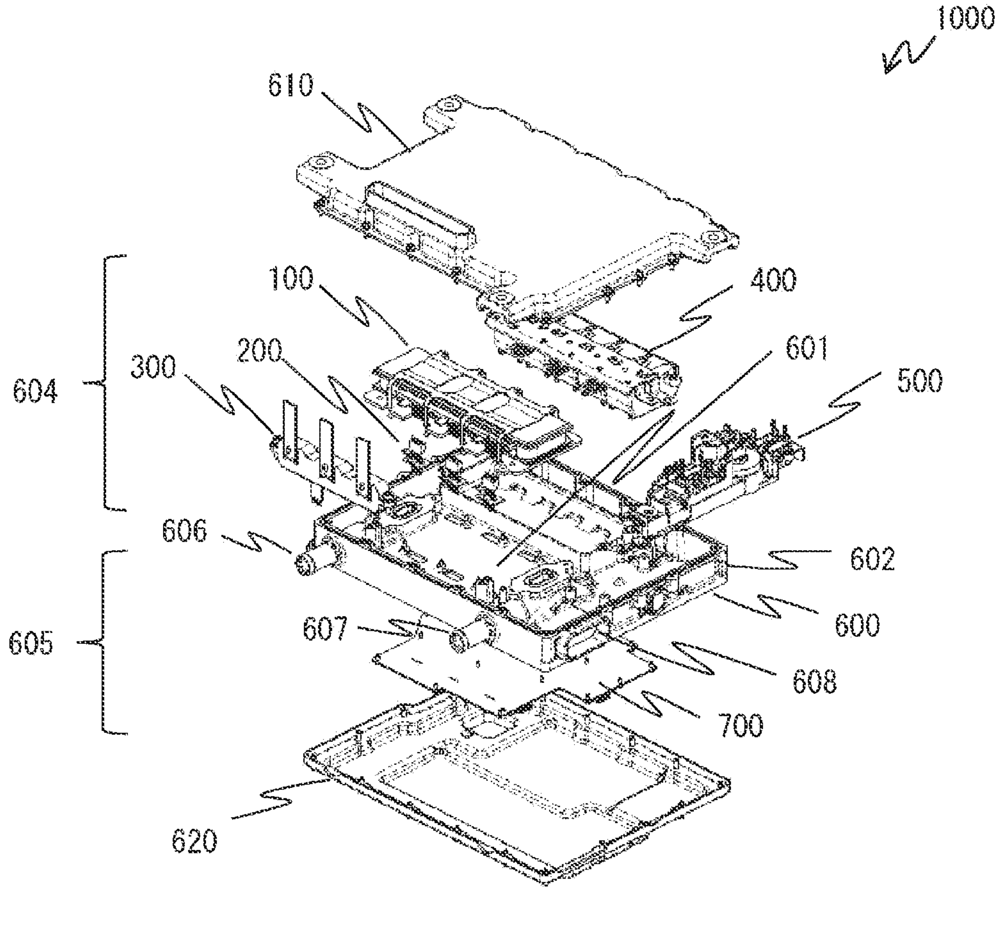
FIG. 1 is an exploded perspective view of a power conversion device.

Hereinafter, embodiments of the present invention will be described with reference to the drawings. The following description and drawings are exemplifications for describing the present invention, and are omitted and simplified as appropriate for clarification of the description. The present invention can be implemented in other various forms. Unless otherwise limited, each component may be singular or plural.

The position, size, shape, range, and the like of each component illustrated in the drawings may not necessarily represent the actual position, size, shape, range, and the like, in order to facilitate understanding of the invention. For this reason, the present invention is not necessarily limited to the position, size, shape, range, and the like disclosed in the drawings.

When there are a plurality of components having the same or similar functions, different subscripts may be given for the same reference numerals for explanation. However, when there is no need to distinguish between these components, the description may be omitted with subscripts omitted.

FIG. 1 is an exploded perspective view of a power conversion device 1000 according to the present embodiment. Although details will be described later, the semiconductor module cooling structure includes a semiconductor module 100 and first and second cooling members 110 and 120 (see FIG. 3(A)) disposed on both surfaces of the semiconductor module 100. The semiconductor module 100 having such a cooling structure is installed in a first space 604 between a lower cover (first lid) 610 and a partition wall 601 of the housing 600. In the first space 604, an AC bus bar 300, a smoothing capacitor 400, and an electromagnetic compatibility (EMC) filter 500 are further installed. A circuit board 700 is installed in a second space 605 between an upper cover (second lid) 620 and the partition wall 601 of the housing 600. The housing 600 includes a partition wall 601 and a side wall 602 formed around the partition wall 601, and is closed by a lower cover 610 and an upper cover 620. A seal ring or a liquid seal is provided between the side wall 602 of the housing 600 and the lower cover 610 and the upper cover 620 to ensure internal airtightness of the power conversion device 1000. The lower cover 610, the upper cover 620, and the housing 600 are mainly made of conductive metal, but other materials may be used.

The semiconductor module 100 is connected to a battery (not illustrated) via the smoothing capacitor 400 and the EMC filter 500, and DC power is supplied from the battery. In addition, the semiconductor module 100 converts DC power into AC power by switching a semiconductor element sealed in the semiconductor module 100. The DC power is supplied from the battery via a DC input unit 608. The converted AC power is output as an AC current from the AC bus bar 300. The output AC current is supplied to a motor (not illustrated) to drive the motor. A current sensor is disposed in the vicinity of the AC bus bar 300.

The capacitor element of the smoothing capacitor 400 is a capacitor element formed of a wound film or the like, has a function of storing charges, and is sealed and fixed with a filler or the like inside a case made of a material such as plastic. The terminal of the smoothing capacitor 400 is a member having a shape such as a round bar or a flat plate formed of a conductive material such as copper, for example, and electrically connects the capacitor element and the external DC bus bar. In the present embodiment, the flat terminal is formed to be exposed from the filling and sealing surface so as to be substantially parallel to the upper surface of the capacitor element.

The control terminal of the semiconductor element led out from the semiconductor module 100 is connected to the circuit board 700 from a relay terminal 200 via the housing 600. Electronic components constituting a drive circuit that drives a semiconductor element are mounted on the circuit board 700. The drive circuit inputs a control signal to a control terminal of the semiconductor element to cause the semiconductor element to perform switching operation. The refrigerant flows through the first and second cooling members 110 and 120 disposed on both surfaces of the semiconductor module 100, and the refrigerant is input to and output from the inlet flow path 606 and the outlet flow path 607 provided in the side wall 602 of the housing 600.

Figure 2:
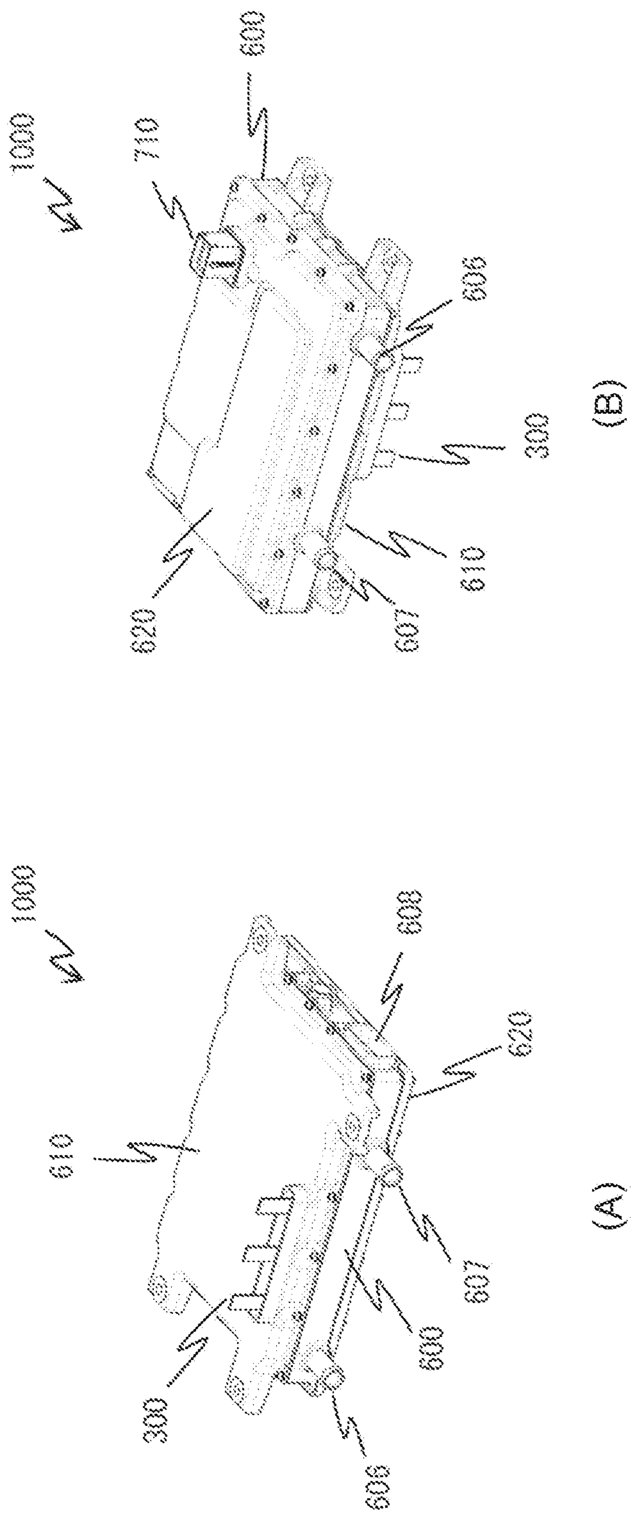
FIGS. 2(A) and 2(B) are perspective views of the power conversion device.

FIGS. 2(A) and 2(B) are perspective views of the power conversion device 1000. FIG. 2(A) is a perspective view of the power conversion device 1000 as viewed from below, and FIG. 2(B) is a perspective view of the power conversion device 1000 as viewed from above.

As illustrated in FIG. 2(A), the AC bus bar 300 protrudes from the lower cover 610 of the power conversion device 1000 and is connected to a motor (not illustrated). Attachment holes for fixing the power conversion device 1000 to a motor or the like with screws are provided at four corners of the lower cover 610.

As illustrated in FIG. 2(B), one of the signal connectors 710 protrudes from the upper cover 620 of the power conversion device 1000 and is connected to an external control device (not illustrated). The other of the signal connectors 710 is connected to an electronic component such as a controller disposed on the circuit board 700. Although one of the signal connectors 710 protrudes from the upper cover 620, the signal connector may protrude from between the upper cover 620 and the side wall 602 of the housing 600.

FIGS. 3(A) and 3(B) are exploded perspective views illustrating the cooling structure of the semiconductor module 100 according to the present embodiment. FIG. 3(A) is an exploded perspective view illustrating the cooling structure, and FIG. 3(B) is a plan view of a base plate 140.

As illustrated in FIG. 3(A), the cooling structure of the semiconductor module 100 includes a semiconductor module 100, first and second cooling members 110 and 120 disposed on both surfaces of the semiconductor module 100, a base plate 140 facing the semiconductor module 100 with the first cooling member 110 interposed therebetween, and a spring plate member 130 pressing the second cooling member 120 toward the semiconductor module 100.

The semiconductor module 100 is formed by sealing a semiconductor element, and in the present embodiment, an example in which three semiconductor modules are arranged in parallel will be described, but the number of semiconductor modules is an example. Note that a plurality of arranged semiconductor modules may be collectively referred to as a semiconductor module 100.

The first and second cooling members 110 and 120 are in close contact with both surfaces of the semiconductor module 100 via a thermal conductive member such as thermal conductive grease or a heat dissipation sheet, and the semiconductor module 100 is cooled by the refrigerant flowing inside the first and second cooling members 110 and 120.

From the semiconductor module 100, a control terminal 101 for inputting a control signal and an AC terminal 102 connected to the AC bus bar 300 are led out. The control terminal 101 is connected to the relay terminal 200 (see FIGS. 6 and 8) to be described later across the first cooling member 110. A DC terminal connected to the DC bus bar is led out on the opposite side of the AC terminal 102, and the DC bus bar is connected to the smoothing capacitor 400 and the EMC filter 500.

In the spring plate member 130, a plurality of leg portions 131 are integrally formed. The plurality of leg portions 131 extend to both side surfaces of the second cooling member 120, the semiconductor module 100, and the first cooling member 110, and are locked to the end portion of the base plate 140. As a result, the spring plate member 130 presses the second cooling member 120 toward the semiconductor module 100. In other words, the second cooling member 120, the semiconductor module 100, and the first cooling member 110 are pressed between the spring plate member 130 and the base plate 140. Two openings 134 are formed in a central portion of the spring plate member 130. The first cooling member 110 and the second cooling member 120 are connected by a water path connection portion 121. As described later, the inlets of the first and second cooling members 110 and 120 are connected to a third flow path for guiding the refrigerant flowing in from the inlet flow path 606, and the outlets of the first and second cooling members 110 and 120 are connected to a fourth flow path for guiding the refrigerant to the outlet flow path 607.

FIG. 3(B) is a top view of the base plate 140.

The base plate 140 has attachment holes 141 into which screws are inserted at four corners. A screw is passed through the attachment hole 141 to fix the structure including the integrated semiconductor module 100 and the first and second cooling members 110 and 120 to the partition wall 601 of the housing 600.

The base plate 140 has a positioning hole 142. The positioning hole 142 is used as positioning for fitting a protruding portion provided in the housing 600 and the positioning hole 142 when the structure is fixed to the housing 600.

In the present embodiment, one leg portion 131 is formed from each of the four corners of the spring plate member 130, and a total of four leg portions 131 are integrally formed on both side surfaces of the semiconductor module 100 by extending toward the base plate 140 at predetermined intervals along the arrangement direction of the semiconductor modules 100. Each leg portion 131 is formed at a predetermined interval at a position separated from the control terminal 101, the AC terminal 102, and the DC terminal derived from the semiconductor module 100 and maintaining an insulation distance.

The base plate 140 has two first locking portions 143 and six second locking portions 144 which are locked to a clip portion 135 provided at the tip of the leg portion 131 of the spring plate member 130. The first locking portion 143 locks and positions the clip portion 135 of the leg portion 131 of the spring plate member 130, has a U-shape corresponding to the cross-sectional shape of the leg portion 131, and is disposed at two diagonal positions of the base plate 140. The second locking portion 144 is locked to the clip portion 135 of the leg portion 131 of the spring plate member 130. In addition, the base plate 140 is provided with a control terminal opening 145 in order to pass the control terminal 101 led out from the semiconductor module 100 toward the circuit board 700.

The spring plate member 130 includes a pressurizing portion 132 that abuts on the second cooling member 120 and a bent portion 133 that connects the pressurizing portion 132 and the leg portion 131. The pressurizing portion 132 is formed at the central portion of the spring plate member 130 along the arrangement direction of the semiconductor modules 100. The bent portion 133 is formed on both sides of the central portion of the spring plate member 130 along the arrangement direction of the semiconductor modules 100. The pressurizing portion 132 at the central portion of the spring plate member 130 protrudes toward the central portion of the second cooling member 120 and abuts on the central portion of the second cooling member 120. The bent portions 133 located on both sides of the central portion of the spring plate member 130 are separated from both sides of the central portion of the second cooling member 120. The tip of the leg portion 131 is bent to form a clip portion 135.

The spring plate member 130 is formed of a material such as stainless steel, and when an external force is applied, a restoring force acts to generate a pressing force. The pressurizing portion 132 of the spring plate member 130 abuts on and presses the central portion of the second cooling member 120 to lock the clip portion 135 of the leg portion 131 of the spring plate member 130 to the base plate 140. Then, the second cooling member 120, the semiconductor module 100, the first cooling member 110, and the base plate 140 are brought into pressure contact with each other by the pressing force of the bent portion 133.

The central portion of the second cooling member 120 is uniformly pressed by the pressurizing portion 132 at the central portion of the spring plate member 130 along the arrangement direction of the semiconductor modules 100, and a surface pressure is applied to the central portion of the semiconductor modules 100. By applying the surface pressure to the central portion, the first and second cooling members 110 and 120 can be uniformly pressed against both surfaces of the semiconductor module 100. As a result, adhesion to a thermal conductive member such as thermal conductive grease applied to both surfaces of the semiconductor module 100 is increased, and cooling performance for the semiconductor module 100 can be favorably maintained. Since the spring plate member 130 having the pressurizing portion 132 and the bent portion 133 can be configured to have a small thickness, the cooling structure can be downsized. Furthermore, since the leg portion 131 has a thin plate shape integrally formed with the spring plate member 130, the leg portion can be disposed along the side surface of the semiconductor module 100, and the cooling structure can be downsized.

Figure 4:
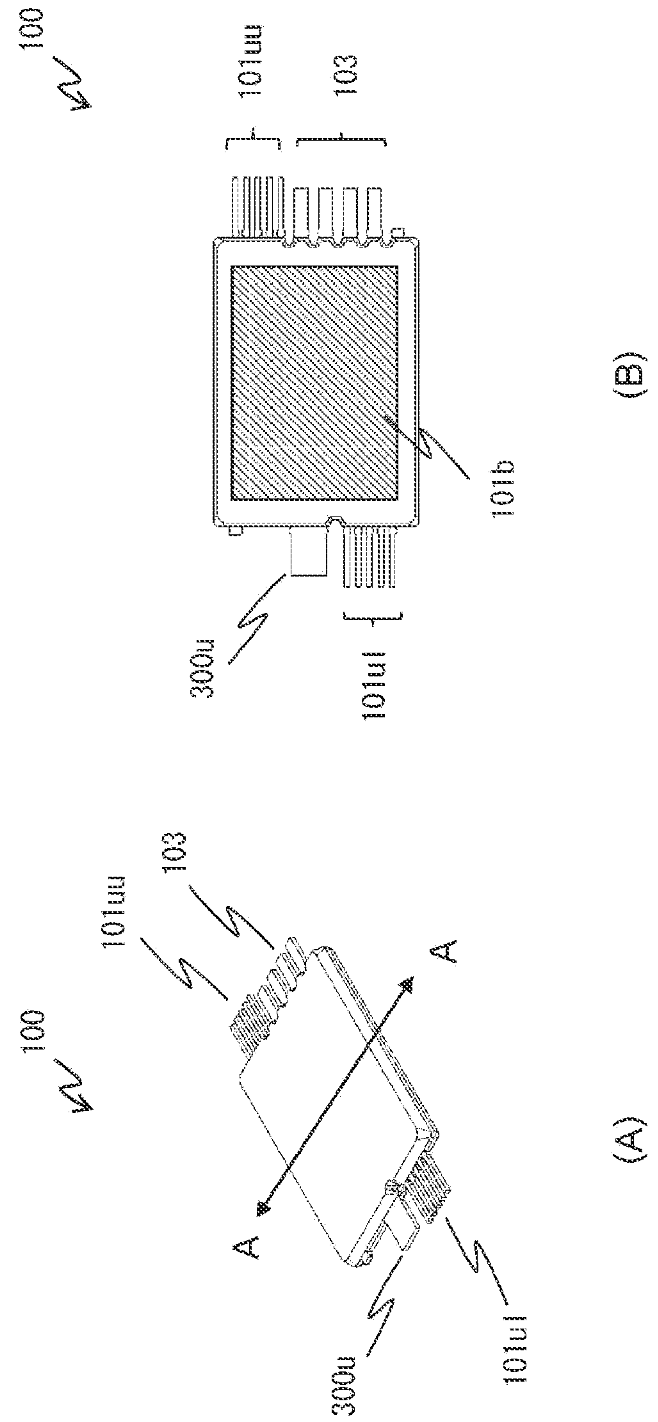
FIGS. 4(A) and 4(B) are diagrams illustrating a semiconductor module before a control terminal is bent.

FIGS. 4(A) and 4(B) are diagrams illustrating one semiconductor module 100 before the control terminal 101 is bent. FIG. 4(A) is an external perspective view, and FIG. 4(B) is a top view.

Although one semiconductor module 100 is illustrated in FIG. 4(A), three semiconductor modules 100 are disposed adjacent to each other in the arrangement direction A. One of the semiconductor modules 100 is configured by, for example, connecting two semiconductor elements corresponding to the U-phase upper and lower arms in series. The semiconductor element is made of, for example, an IGBT or a diode. The other two semiconductor modules 100 are semiconductor elements corresponding to the upper and lower arms of the V phase and the W phase.

As illustrated in FIG. 4(A), in the semiconductor module 100 before the plurality of control terminals 101 are bent, the U-phase AC terminal 300*u* and the DC terminals 103 connected to both ends of the upper and lower arms are led out straight to opposite sides in the horizontal direction along the surface of the semiconductor module 100 orthogonal to the arrangement direction A. Further, control terminals 101*uu* and 101*ul* respectively connected to the gate electrodes of the two semiconductor elements are led out straight to opposite sides. Each of the control terminals 101*uu* and 101*ul* has a plurality of control terminals.

FIG. 4(B) is a top view of one semiconductor module 100, but the upper surface of the semiconductor module 100 has a cooling surface 101*b* for cooling the semiconductor element that has generated heat, and the second cooling member 120 is in close contact with the cooling surface 101*b* via a thermal conductive member. Although not illustrated, the lower surface of the semiconductor module 100 similarly has a cooling surface 101*a*, and the first cooling member 110 is in close contact with the cooling surface 101*a* via a thermal conductive member.

Figure 5:
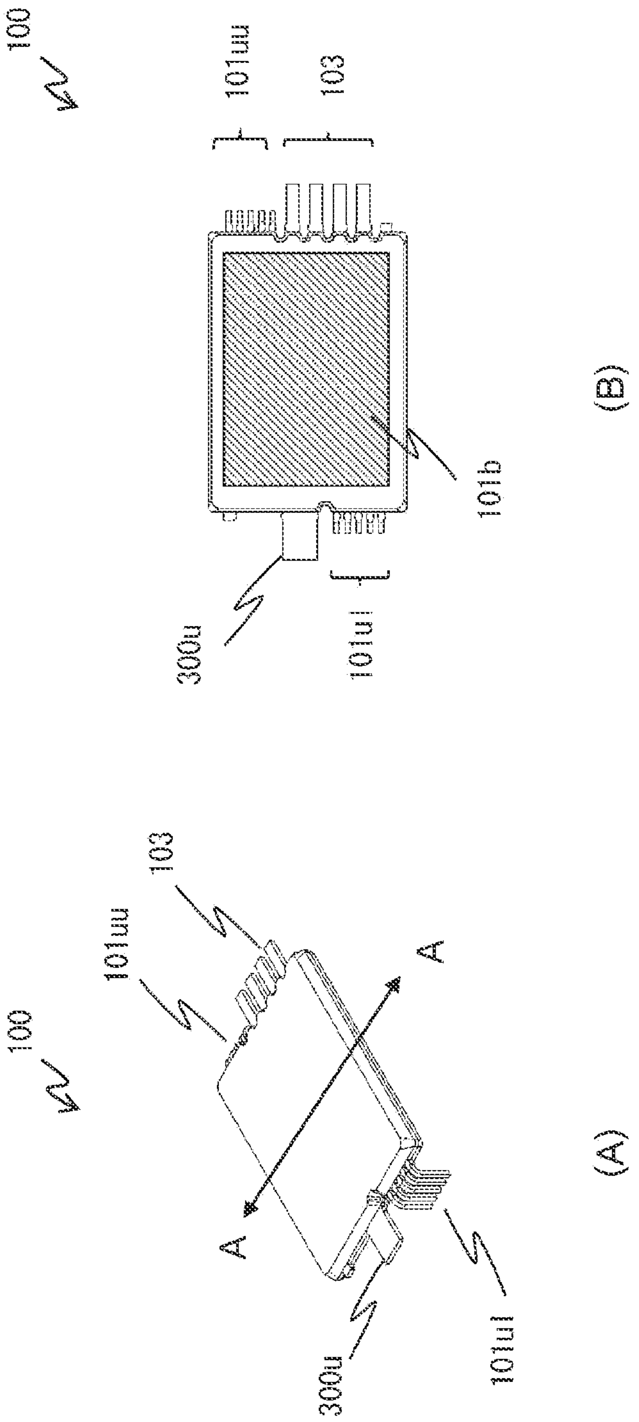
FIGS. 5(A) and 5(B) are diagrams illustrating the semiconductor module after the control terminal is bent.

FIGS. 5(A) and 5(B) are diagrams illustrating one semiconductor module 100 after the control terminal 101 is bent. FIG. 5(A) is an external perspective view, and FIG. 5(B) is a top view. The same portions as those in FIGS. 4(A) and 4(B) are denoted by the same reference numerals, and the description thereof will be simplified.

The control terminals 101*uu* and 101*ul* are bent downward in the drawing from the horizontal direction illustrated in FIGS. 4(A) and 4(B) in order to connect to the circuit board 700 across the first cooling member 110. As a result, as illustrated in FIGS. 5(A) and 5(B), the plurality of control terminals 101 are bent downward and connected to the circuit board 700 via the relay terminal 200 as described later.

FIGS. 6(A) and 6(B) are diagrams illustrating the relay terminal 200. FIG. 6(A) is an external perspective view, and FIG. 6(B) is a side view.

As illustrated in FIG. 6(A), in the relay terminal 200, a plurality of (five in the present embodiment) terminal conductors 201 as many as the control terminals 101 are arranged in parallel. The relay terminal 200 includes a fixing portion 202 that integrally fixes the plurality of terminal conductors 201, and a guide portion 203 that guides insertion of the plurality of control terminals 101 from the semiconductor element. The fixing portion 202 and the guide portion 203 are connected by a plurality of terminal conductors 201. The fixing portion 202 and the guide portion 203 are formed of an insulating resin, and fix and hold the plurality of terminal conductors 201.

The fixing portion 202 of the relay terminal 200 includes a flange portion 202*a*, a positioning portion 202*b*, and an engagement portion 202*c*. When the relay terminal 200 is fixed to the partition wall 601 of the housing 600, the lower surface of the flange portion 202*a* abuts on the upper surface of the partition wall 601, and the flange portion 202*a* holds the relay terminal 200 in an upright state. The positioning portion 202*b* is fitted with a protrusion previously provided on the upper surface of the partition wall 601 to position the relay terminal 200. A screw or the like may be used for the positioning portion 202*b* to be fixed to the housing 600. As illustrated in FIG. 6(B), two opposing leg portions extend in the engagement portion 202*c*, and when the leg portion of the relay terminal 200 is inserted into the arrangement hole of the relay terminal 200 provided in advance in the partition wall 601, the two leg portions are locked through the arrangement hole to the lower surface of the partition wall 601 forming the arrangement hole.

As illustrated in FIG. 6(B), the guide portion 203 of the relay terminal 200 includes a plurality of guide holes 203*a* into which a plurality of control terminals 101 from the semiconductor element are inserted. A corresponding terminal conductor 201 is disposed in each guide hole 203*a*, and when the control terminal 101 is guided by the guide hole 203*a* and inserted, the control terminal 101 and the terminal conductor 201 come into contact with each other. After the control terminal 101 is inserted, an upper end portion 201*a* of the terminal conductor 201 is connected to the control terminal 101. The lower end portion 201*c* of the terminal conductor 201 is connected to the circuit board 700.

Figure 7:
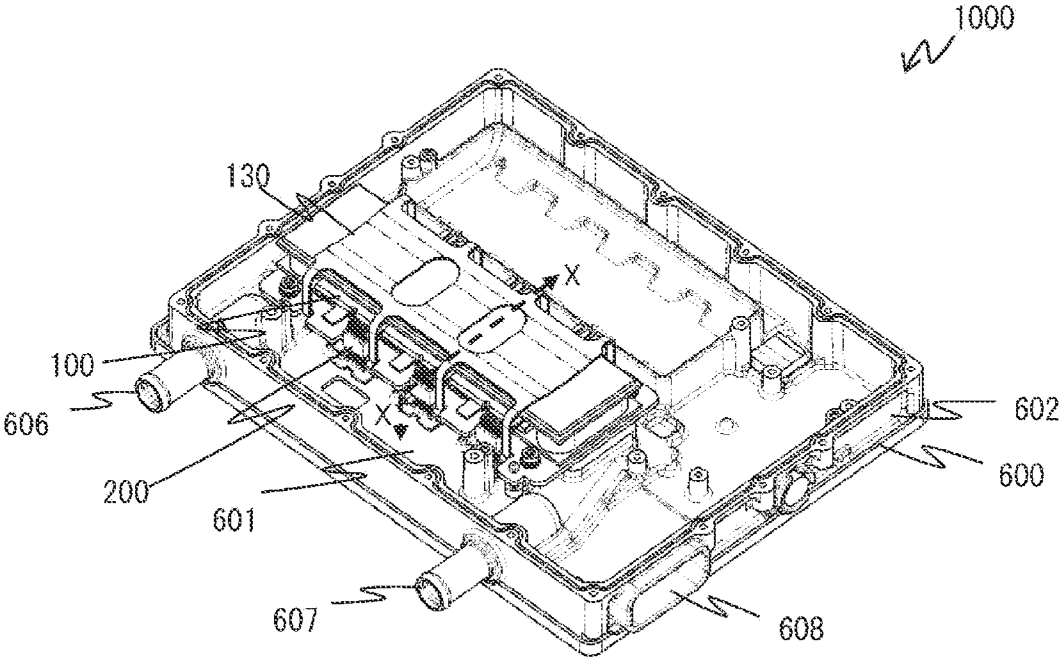
FIG. 7 is an external perspective view in which a semiconductor module is installed in a housing.

FIG. 7 is an external perspective view in which the semiconductor module 100 is installed in the housing 600. The same portions as those in FIG. 1 are denoted by the same reference numerals, and the description thereof will be simplified.

The semiconductor module 100 is installed on the partition wall 601 of the housing 600. Three semiconductor modules 100 are arrayed, and as described with reference to FIG. 5, three control terminals 101 are led out to the opposite side in the horizontal direction along the surface of the semiconductor module 100 orthogonal to the arrangement direction A of the semiconductor modules 100, that is, a total of six control terminals. The six control terminals 101 are connected to the circuit board 700 via the six relay terminals 200. The relay terminal 200 is installed on the partition wall 601 of the housing 600.

Figure 3:
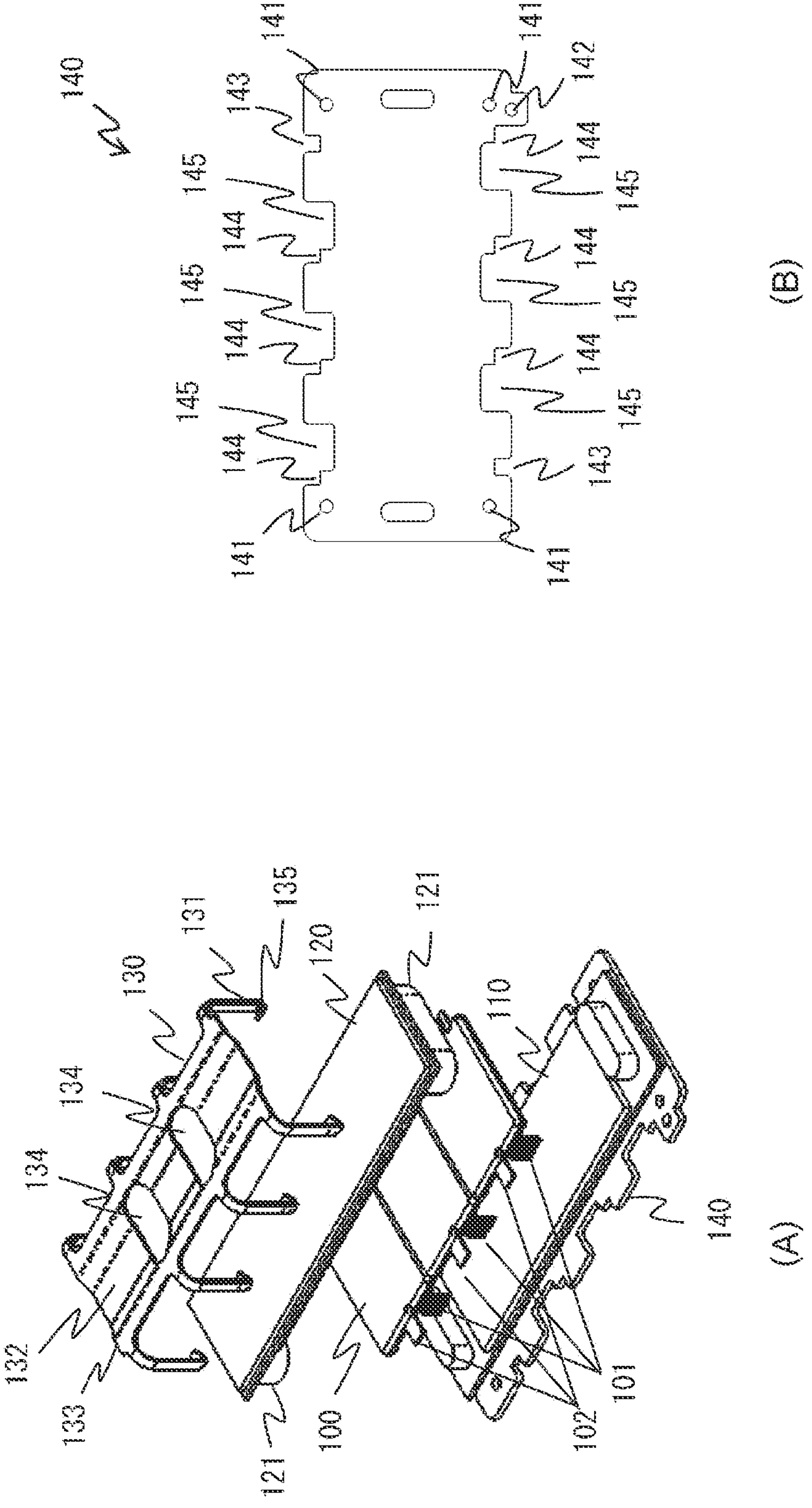
FIGS. 3(A) and 3(B) are exploded perspective views illustrating a cooling structure of a semiconductor module.
Figure 6:
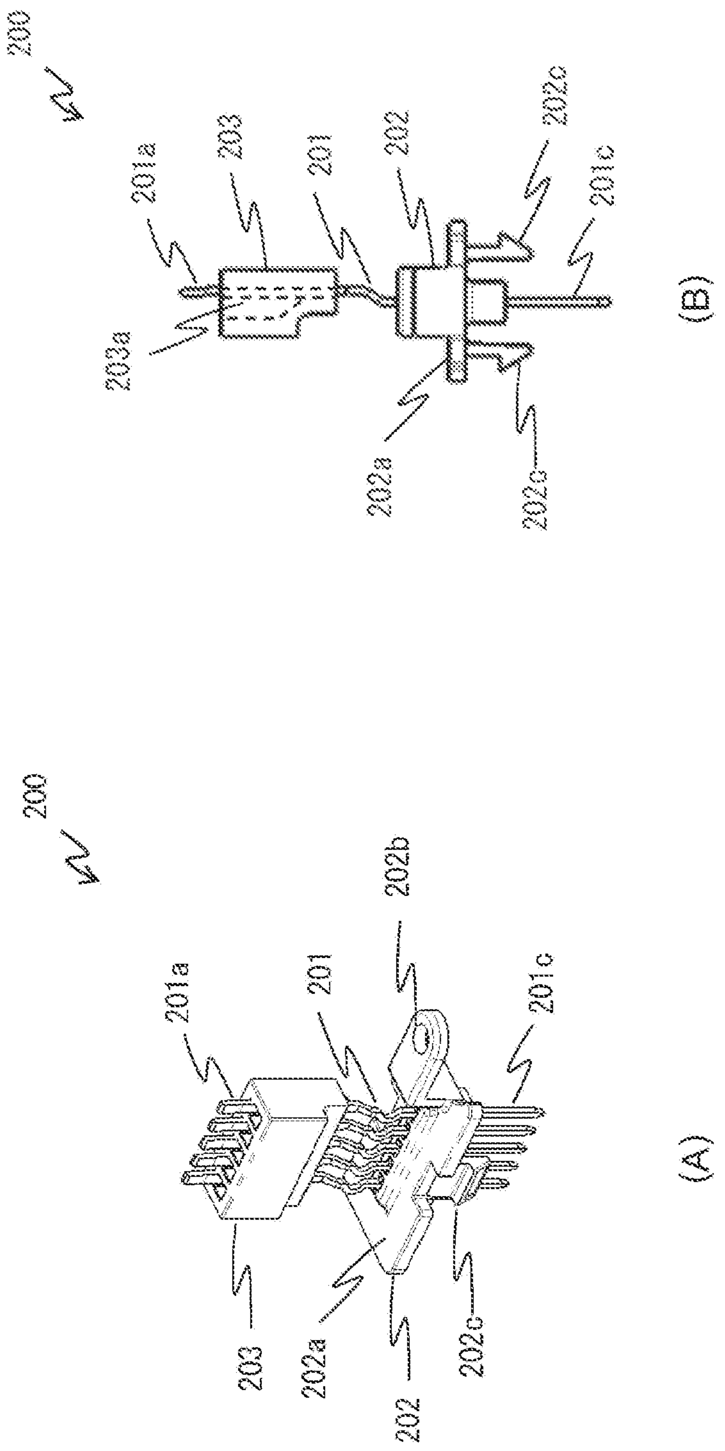
FIGS. 6(A) and 6(B) are diagrams illustrating relay terminals.
Figure 8:
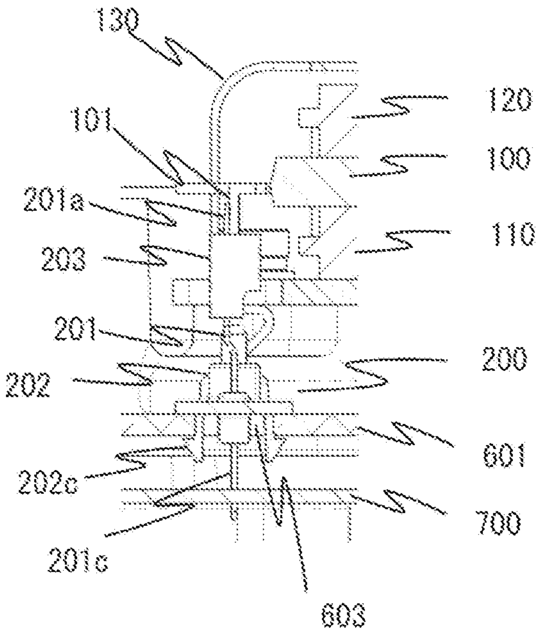
FIG. 8 is a partially enlarged cross-sectional view of a state in which a semiconductor module is installed in a housing.

FIG. 8 is a partially enlarged cross-sectional view of a state in which the semiconductor module 100 is installed in the housing 600. The drawing is a cross-sectional view taken along line X-X in FIG. 7. The same portions as those in FIGS. 3, 6, and 7 are denoted by the same reference numerals, and the description thereof will be briefly made.

As illustrated in FIG. 8, the relay terminal 200 is installed in an arrangement hole 603 provided in the partition wall 601 of the housing 600. In the relay terminal 200, two leg portions of the engagement portion 202*c* are locked to the lower surface of the partition wall 601 through the arrangement hole 603.

The control terminal 101 is inserted into the guide portion 203 of the relay terminal 200, and the control terminal 101 is connected to the upper end portion 201*a* of the terminal conductor 201. The connection between the control terminal 101 and the upper end portion 201*a* may be connection by welding, connection by soldering, or other connection. The lower end portion 201*c* of the terminal conductor 201 is inserted through the through hole of the circuit board 700 and connected to the wiring pattern of the circuit board 700 by soldering.

Although the example in which the relay terminal 200 is fixed to the partition wall 601 of the housing 600 has been described, the relay terminal may be fixed to a relay member disposed between the semiconductor module 100 and the circuit board 700, for example, the first cooling member 110 or another member of the housing 600.

In the relay terminal 200, since the fixing portion 202 and the guide portion 203 are connected by the plurality of terminal conductors 201, even if positional deviation occurs between the upper end portion 201*a* and the lower end portion 201*c* of the terminal conductor 201, the positional deviation can be absorbed. Therefore, durability against vibration, thermal change, and the like under a severe use environment of the power conversion device 1000 is improved. The relay terminal 200 may be integrally formed of resin or the like without separating the fixing portion 202 and the guide portion 203 from each other. Also in this case, since the control terminal 101 is connected to the circuit board 700 via the relay terminal 200, even if positional deviation occurs between the semiconductor module 100 and the circuit board 700, this can be absorbed, and durability against vibration, thermal change, and the like in a severe use environment of the power conversion device 1000 is improved. Furthermore, by using the relay terminal 200, it is possible to connect to the circuit board 700 across the first cooling member 110 and the partition wall 601 without lengthening the control terminal 101 led out from the semiconductor module 100. In a case where the relay terminal 200 is not used, it is necessary to lengthen the control terminal 101, and under a severe use environment of the power conversion device 1000, there arises a problem that a plurality of control terminals 101 are short-circuited or disconnected due to vibration, thermal change, or the like, a problem that dimensional accuracy is increased because it is necessary to connect the long control terminal 101 to the circuit board 700, and a problem that it takes time and effort to assemble the control terminal. According to the present embodiment, the assemblability and durability of the power conversion device 1000 are improved.

Figure 9:
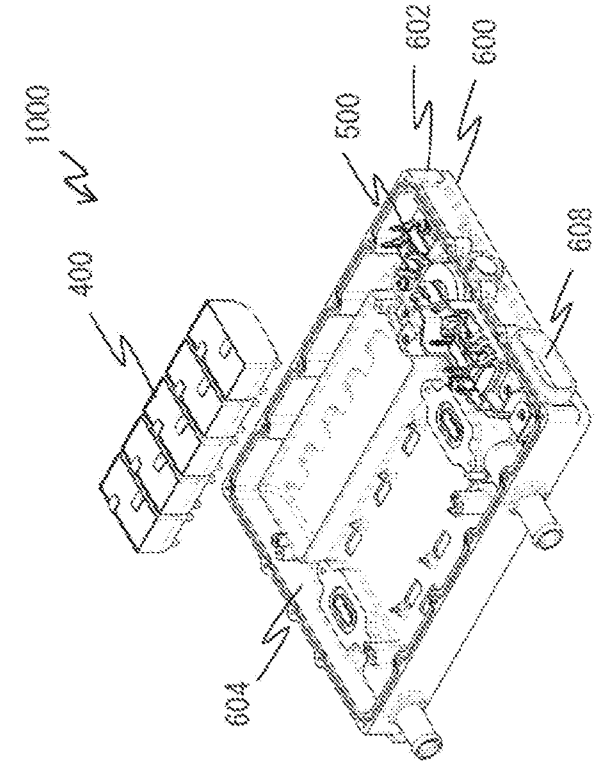
FIGS. 9(A) and 9(B) are diagrams illustrating assembly processes of the power conversion device.
Figure 9:
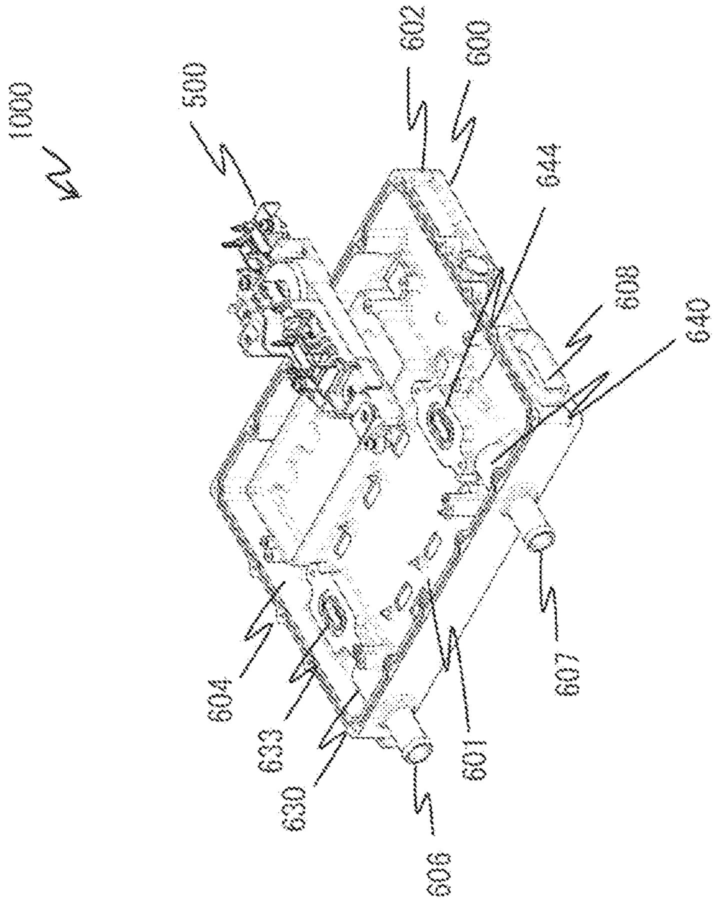

FIGS. 9(A) and 9(B) are diagrams illustrating assembly processes of the power conversion device 1000. FIG. 9(A) illustrates a first process, and FIG. 9(B) illustrates a second process.

In the first process illustrated in FIG. 9(A), the EMC filter 500 is disposed in the first space 604. If necessary, potting is performed between the EMC filter 500 and the housing 600 in order to improve cooling performance. Potting is processing of applying and curing a transparent polyurethane resin obtained by chemically reacting a polyol as a main agent with an isocyanate as a curing agent.

The partition wall 601 includes a third flow path 630 that guides the refrigerant flowing from the inlet flow path 606 to the inlets 633 of the first and second cooling members 110 and 120, and a fourth flow path 640 that guides the refrigerant from the outlets 644 of the first and second cooling members 110 and 120 to the outlet flow path 607. That is, the third flow path 630 has a recess formed in the partition wall 601, and is formed between the recess and the flow path cover 631 (see FIG. 12). Similarly, the fourth flow path 640 has a recess formed in partition wall 601, and is formed between this recess and flow path cover 631.

In the second process illustrated in FIG. 9(B), the smoothing capacitor 400 is disposed in the first space 604. If necessary, potting is performed between the smoothing capacitor 400 and the housing 600 in order to improve cooling performance.

Figure 10:
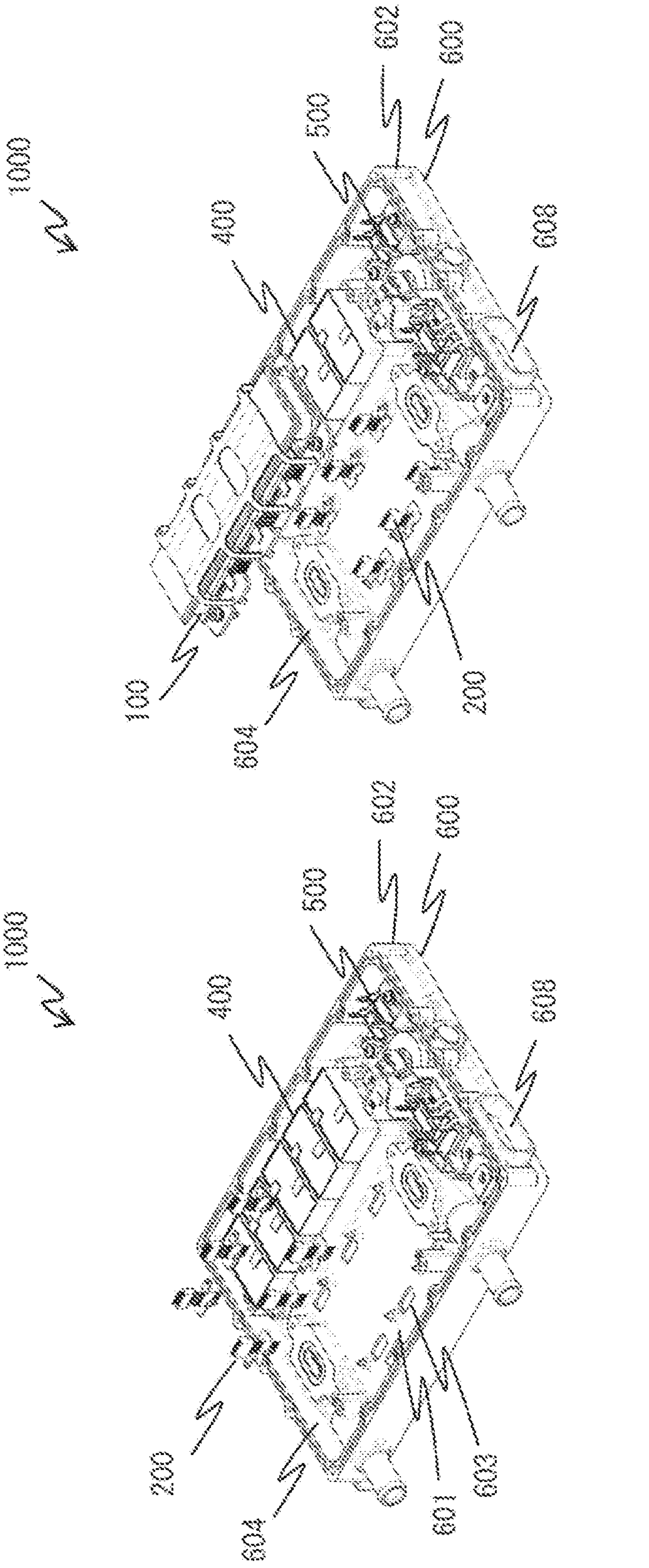
FIGS. 10(A) and 10(B) are diagrams illustrating assembly processes of the power conversion device.

FIGS. 10(A) and 10(B) are diagrams illustrating assembly processes of the power conversion device 1000. FIG. 10(A) illustrates the third process, and FIG. 10(B) illustrates the fourth process.

In the third process illustrated in FIG. 10(A), the six relay terminals 200 are installed in the arrangement holes 603 provided in the partition wall 601 of the housing 600. The relay terminal 200 positions the relay terminal 200 by fitting the positioning portion 202*b* (see FIG. 6(A)) with a protrusion provided in advance on the upper surface of the partition wall 601. Then, two leg portions of the engagement portion 202*c* of the relay terminal 200 are locked to the lower surface of the partition wall 601 through the arrangement hole 603, and the lower surface of the flange portion 202*a* of the relay terminal 200 abuts on the upper surface of the partition wall 601 to hold the relay terminal 200 in an upright state.

In the fourth process illustrated in FIG. 10(B), the semiconductor module 100 is disposed in the first space 604. The control terminal 101 led out from the semiconductor module 100 is inserted into the guide portion 203 (see FIG. 6(A)) of the relay terminal 200. Thereafter, the control terminal 101 is connected to the upper end portion 201*a* of the terminal conductor 201. The connection between the control terminal 101 and the upper end portion 201*a* may be connection by welding, connection by soldering, or other connection.

Figure 11:
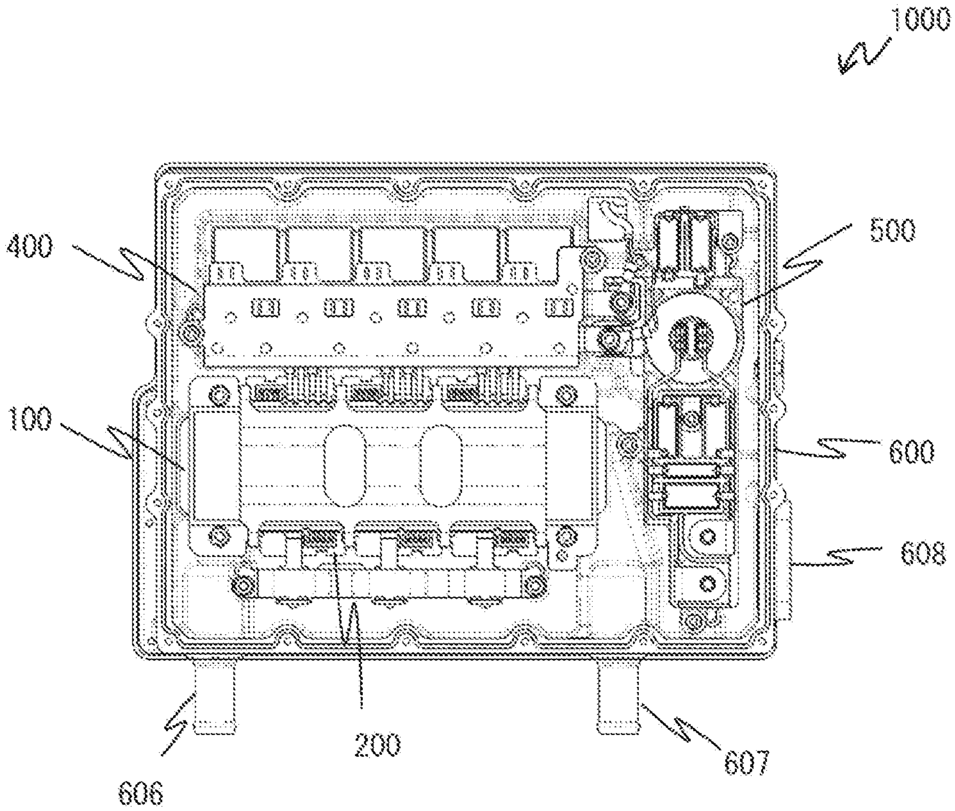
FIG. 11 is a bottom view of the power conversion device as viewed from below.

FIG. 11 is a bottom view of the power conversion device 1000 as viewed from below, and illustrates a state in which the lower cover 610 is removed.

Through the first to fourth processes described above, the EMC filter 500, the smoothing capacitor 400, and the semiconductor module 100 are installed in the housing 600, and the terminals thereof are connected by welding or the like. The control terminal 101 of the semiconductor module 100 is connected to the relay terminal 200. The refrigerant flows into the first and second cooling members 110 and 120 disposed on both surfaces of the semiconductor module 100 from the inlet flow path 606, passes through the first and second cooling members 110 and 120, and cools the semiconductor module 100 from both surfaces. Then, the refrigerant flows out of the outlet flow path 607, flows in again from the inlet flow path 606, and is circulated by a pump (not illustrated).

Figure 12:
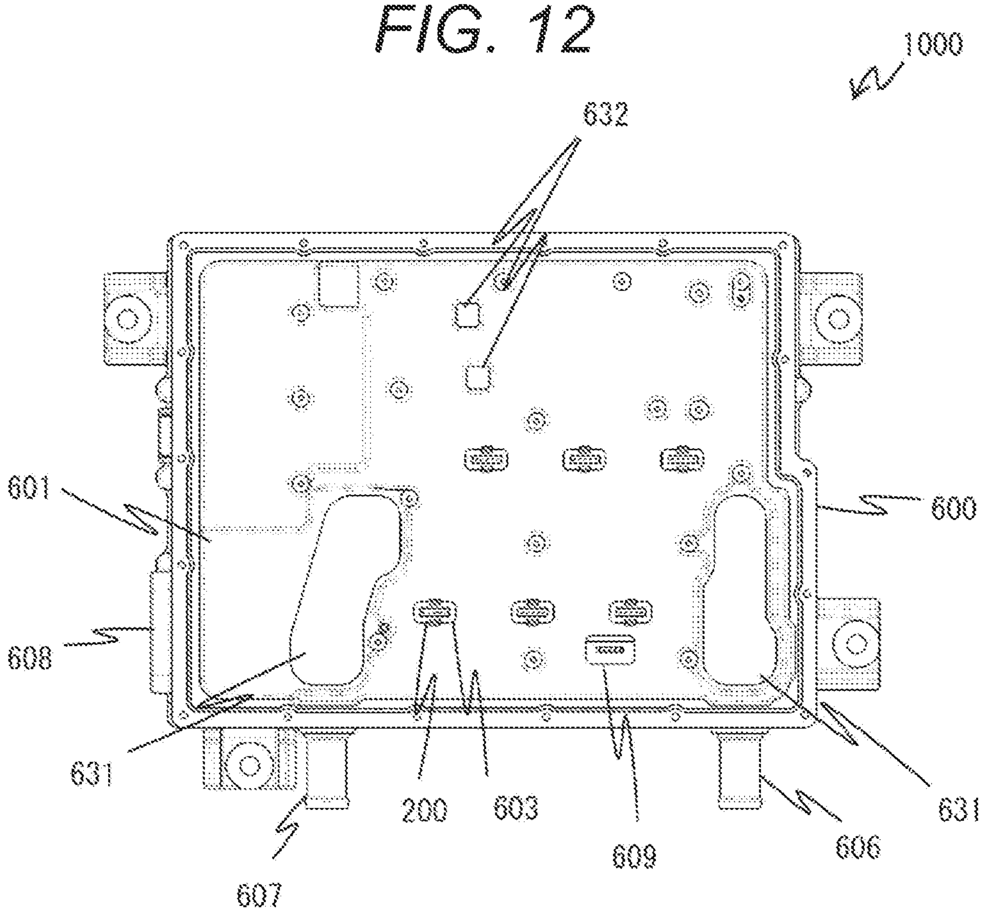
FIG. 12 is a top view of the power conversion device as viewed from above.

FIG. 12 is a top view of the power conversion device 1000 as viewed from above, and illustrates a state in which the upper cover 620 and the circuit board 700 under the upper cover are removed.

As illustrated in FIG. 12, six relay terminals 200 are installed in six arrangement holes 603 in the partition wall 601 of the housing 600. The partition wall 601 is provided with an opening 609 through which a signal line from the current sensor passes. The third flow path 630 and the fourth flow path 640 are formed in the partition wall 601. The third flow path 630 forms a recess in the partition wall 601, and is formed between the recess and the flow path cover 631. Similarly, the fourth flow path 640 has a recess formed in partition wall 601, and is formed between this recess and flow path cover 631. The flow path cover 631 and the partition wall 601 are joined by friction stir welding. A structure in which the flow path cover 631 is screwed using a general seal ring or a liquid seal may be adopted.

The partition wall 601 is provided with the cooling seat 632 for the circuit board 700. When the circuit board 700 is fixed to the partition wall 601 with screws or the like, the cooling seat 632 and the circuit board 700 come into contact with each other to cool the electronic components disposed on the circuit board 700 via the cooling seat 632. Since the third flow path 630 and the fourth flow path 640 are formed in the partition wall 601, the partition wall 601 is cooled, and cooling heat can be transferred to the circuit board 700 via the cooling seat 632 provided in the partition wall 601.

Although not illustrated, the circuit board 700 is fixed to the partition wall 601 with screws or the like on the partition wall 601. Since the circuit board 700 is directly fixed to the partition wall 601 constituting the housing 600 with screws or the like, the rigidity of the circuit board 700 can be maintained high as compared with a case where the circuit board is fixed with another component interposed therebetween. Therefore, it is possible to reduce shake, deformation, and the like with respect to an external force such as vibration. Then, the lower end portion 201*c* of the terminal conductor 201 of the relay terminal 200 is inserted into the through hole of the circuit board 700, and is connected to the wiring pattern of the circuit board 700 by soldering.

Figure 13:
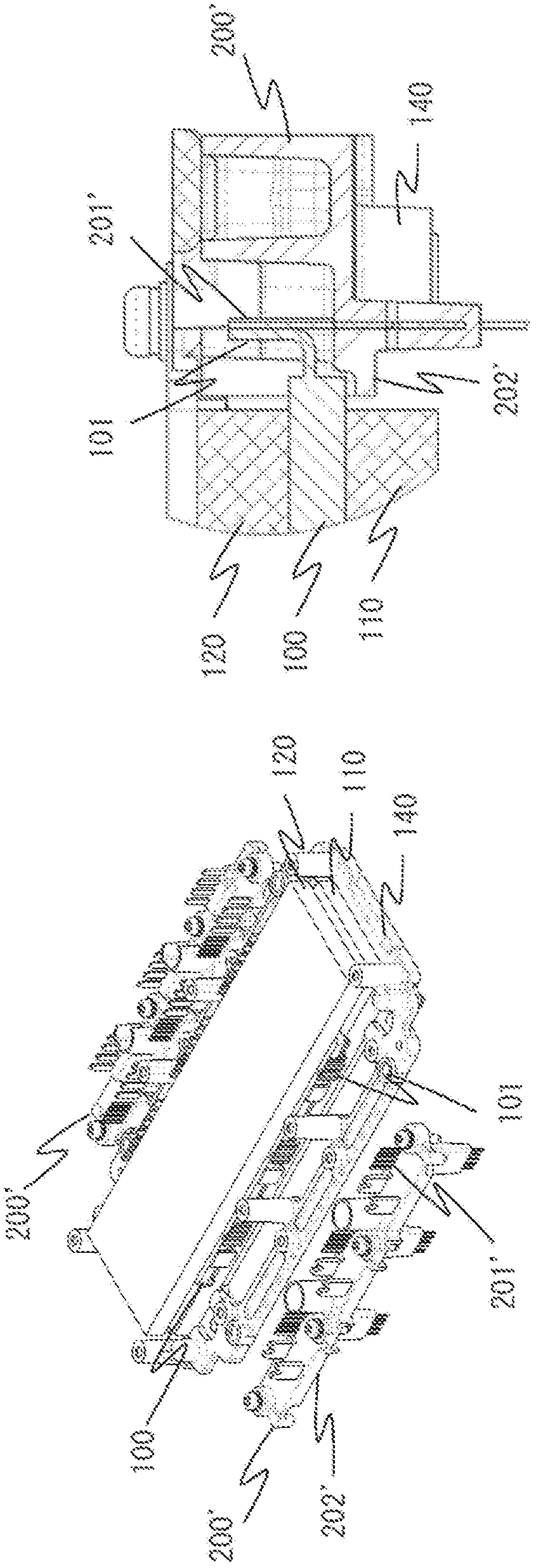
FIGS. 13(A) and 13(B) are diagrams illustrating Modification 1 of the present embodiment.

FIGS. 13(A) and 13(B) are diagrams illustrating Modification 1 of the present embodiment. In Modification 1, a relay terminal 200' is integrally formed, and a terminal conductor 201' is directed downward in the drawing. FIG. 13(A) is a perspective view of the semiconductor module 100 and the relay terminal 200', and FIG. 13(B) is a cross-sectional view of the relay terminal 200'.

As illustrated in FIG. 13(A), the semiconductor module 100 and the first and second cooling members 110 and 120 disposed on both surfaces of the semiconductor module 100 are fixed to the base plate 140. The base plate 140 is fixed to the partition wall 601 of the housing 600.

Three semiconductor modules 100 are arranged and provided, and the relay terminals 200' include fixing portions 202' that integrally fix three control terminals 101 of the semiconductor elements led out from the three semiconductor modules 100. The fixing portion 202' is formed of an insulating resin, and fixes and holds the three terminal conductors 201'. The relay terminals 200' are provided on both sides of the array of the semiconductor modules 100 and are installed on the base plate 140 by screws.

FIG. 13(B) is a cross-sectional view of a state in which the relay terminal 200' is installed on the base plate 140. The control terminal 101 is bent upward in the drawing. The control terminal 101 is connected to the upper end portion of the terminal conductor 201'. The connection between the control terminal 101 and the upper end portion of the terminal conductor 201' may be connection by welding, connection by soldering, or other connection. A lower end portion of the terminal conductor 201' is connected to the circuit board 700.

Figure 14:
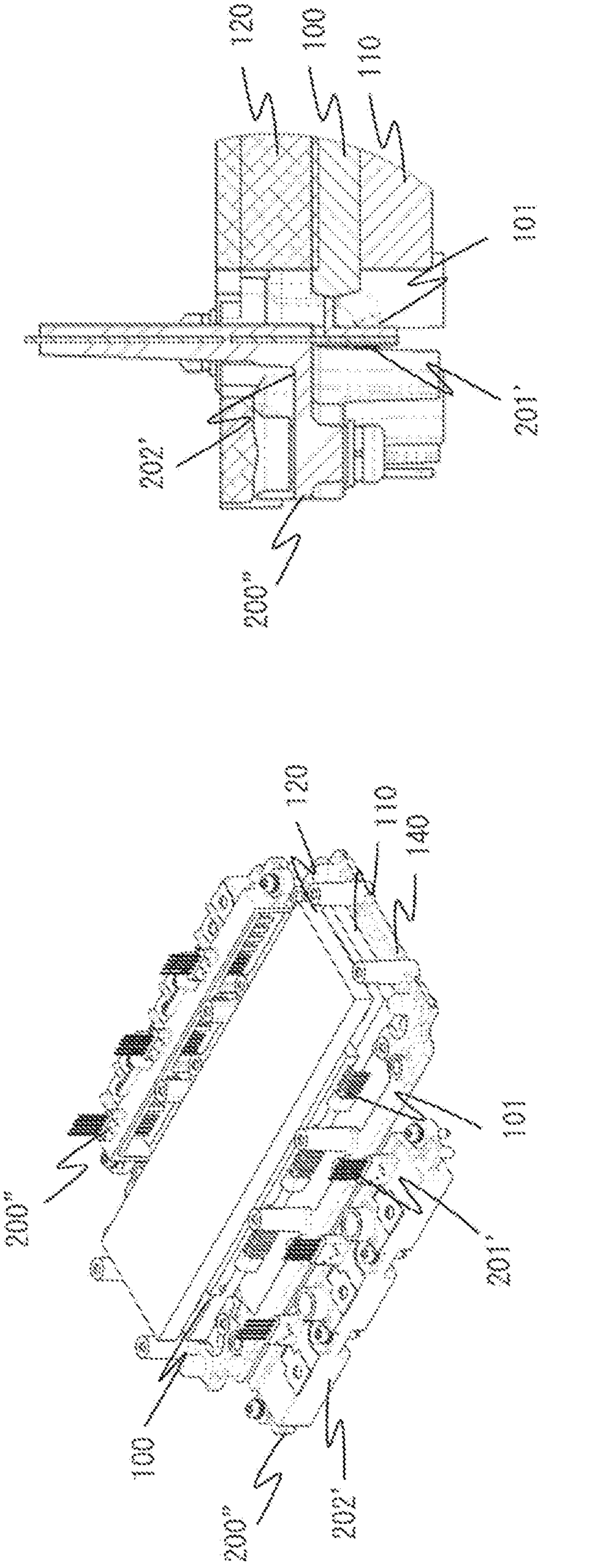
FIGS. 14(A) and 14(B) are diagrams illustrating Modification 2 of the present embodiment.

FIGS. 14(A) and 14(B) are diagrams illustrating Modification 2 of the present embodiment. In Modification 2, a relay terminal 200" is integrally formed, and the terminal conductor 201' is oriented in the upward direction in the drawing. FIG. 14(A) is a perspective view of the semiconductor module 100 and the relay terminal 200'', FIG. 14(B) is a cross-sectional view of the relay terminal 200''.

As illustrated in FIG. 14(A), the semiconductor module 100 and the first and second cooling members 110 and 120 disposed on both surfaces of the semiconductor module 100 are fixed to the base plate 140. The base plate 140 is fixed to the partition wall 601 of the housing 600.

Three semiconductor modules 100 are arranged and provided, and the relay terminals 200'' include the fixing portions 202' for integrally fixing three control terminals 101 of the semiconductor elements led out from the three semiconductor modules 100. The fixing portion 202' is formed of an insulating resin, and fixes and holds the three terminal conductors 201'. The relay terminals 200'' are provided on both sides of the arrangement of the semiconductor modules 100 and are installed on the base plate 140 by screws.

FIG. 14(B) is a cross-sectional view of a state in which the relay terminal 200'' is installed on the base plate 140. The control terminal 101 is bent downward in the drawing. Then, the control terminal 101 is connected to the lower end portion of the terminal conductor 201'. The connection between the control terminal 101 and the lower end portion of the terminal conductor 201' may be connection by welding, connection by soldering, or other connection. An upper end portion of the terminal conductor 201' is connected to a substrate provided above the semiconductor module 100. Electronic components of a drive circuit that drives the semiconductor module 100 are mounted on the substrate. As described above, by changing the orientation of the terminal conductor 201' of the relay terminal 200'', the degree of freedom in layout of the substrate and the like is improved. Note that the orientation of the terminal conductor 201 of the relay terminal 200 described with reference to FIG. 6 may be changed. Also in this case, the degree of freedom in layout of the circuit board 700 and the like is improved.

According to Modifications 1 and 2, since the relay terminals 200' and 200'' can integrally fix the plurality of control terminals 101 led out from the plurality of semiconductor modules 100, it is possible to simplify the manufacturing and assembly of the power conversion device 1000, and the durability of the power conversion device 1000 against vibration, thermal change, and the like under a severe use environment is improved.

Figure 15:
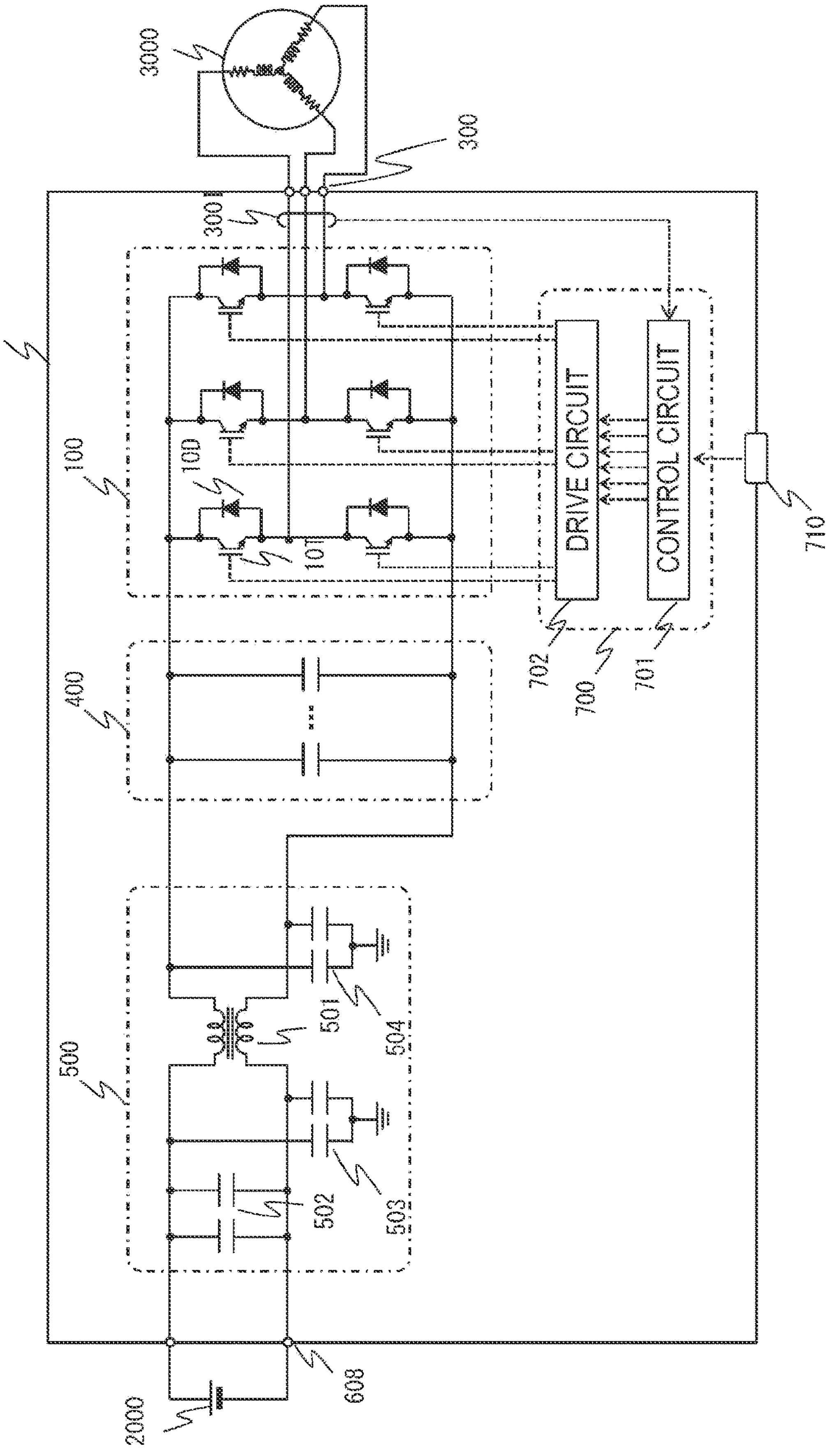
FIG. 15 is a circuit configuration diagram of the power conversion device.

FIG. 15 is a circuit configuration diagram of the power conversion device 1000.

The power conversion device 1000 converts DC power supplied from the battery 2000 via the DC input unit 608 into AC power, and outputs an AC current to the AC bus bar 300. The output AC current is supplied to the motor 3000 to drive the motor 3000.

The power conversion device 1000 includes an EMC filter 500, a smoothing capacitor 400, a semiconductor module 100, and a circuit board 700. The first and second cooling members 110 and 120, the third flow path 630, the fourth flow path 640, the relay terminal 200, and the like disposed on both surfaces of the semiconductor module 100 are not illustrated.

The EMC filter 500 is connected to the positive electrode wiring and the negative electrode wiring from the battery 2000. The EMC filter 500 includes a magnetic filter core 501 surrounding a DC wiring including a positive electrode wiring and a negative electrode wiring, an X capacitor 502 and a Y capacitor 503 connected to the DC wiring at a preceding stage of the filter core 501, and a Y capacitor 504 connected to the DC wiring at a subsequent stage of the filter core 501. The Y capacitors 503 and 504 are connected between the positive electrode wiring line and GND and between the negative electrode wiring line and GND. The Y capacitors 503 and 504 and the filter core 501 reduce common mode noise. The X capacitor 502 is used to reduce normal mode noise. In order to suppress high voltage conduction noise in a wide frequency band, two capacitors connected in parallel and having different capacitances are generally used.

The smoothing capacitor 400 is connected to the positive electrode wiring and the negative electrode wiring from the EMC filter 500. The smoothing capacitor 400 smooths a DC voltage applied to the semiconductor module 100 by suppressing a ripple voltage and a ripple current generated in a DC wiring which is a bus bar connected to a DC high voltage during a switching operation of a semiconductor element in the semiconductor module 100.

The semiconductor module 100 is connected to the positive electrode wiring and the negative electrode wiring (DC bus bar) from the smoothing capacitor 400. The semiconductor module 100 has a semiconductor element sealed in the semiconductor module 100. An insulated gate bipolar transistor is used as the semiconductor element, and is hereinafter referred to as an IGBT. An IGBT 10T and a diode 10D operating as the upper arm and an IGBT 10T and a diode 10D operating as the lower arm constitute a series circuit of the upper and lower arms. One semiconductor module 100 includes this series circuit of upper and lower arms. The entire semiconductor module 100 includes three semiconductor modules 100 corresponding to three phases of a U phase, a V phase, and a W phase of AC power. The collector electrode of the IGBT 10T of the upper arm is electrically connected to the terminal on the positive electrode side of the smoothing capacitor 400 via the positive electrode terminal. An emitter electrode of the IGBT 10T in the lower arm is electrically connected to the terminal on the negative electrode side of the smoothing capacitor 400 via the negative electrode terminal. Then, an inverter circuit is configured using the three semiconductor modules 100, and a series circuit of upper and lower arms of each of the three phases outputs an AC current from an intermediate electrode which is a midpoint portion of the series circuit from the AC bus bar 300. A current sensor 3001 is provided in the vicinity of the output line of each phase of the AC bus bar 300. Note that a metal oxide semiconductor field effect transistor (hereinafter, referred to as a MOSFET) may be used as the semiconductor element. In this case, the diode 10D is unnecessary.

Electronic components constituting the control circuit 701 and the drive circuit 702 are mounted on the circuit board 700. The control circuit 701 receives a control command from the host control device via the signal connector 710. The control circuit 701 includes a microcomputer for calculating the switching timing of the IGBT 10T. A current value detected by the current sensor 3001 and a magnetic pole position from a rotating magnetic pole sensor (not illustrated) such as a resolver provided in the motor 3000 are input to the microcomputer. The microcomputer generates control pulses for controlling the IGBTs 10T constituting the upper arm or the lower arm of the series circuit of each phase constituting the inverter circuit on the basis of the current value, the magnetic pole position, and the target torque value from the host control device, and supplies the control pulses to the drive circuit 702.

The drive circuit 702 supplies drive pulses for driving the IGBTs 10T constituting the upper arm or the lower arm of the series circuit of each phase to the IGBT 10T of each phase based on the control pulses generated by the control circuit 701. The IGBT 10T performs conduction or cutoff operation based on the drive pulse from the drive circuit 702, converts DC power supplied from the battery 2000 into three-phase AC power, and drives the motor 3000 with the converted power.

According to the above embodiment, the following operational effects are obtained.

(1) In the power conversion device 1000, a semiconductor module 100 in which a semiconductor element is sealed, a circuit board 700 on which a drive circuit 702 that drives the semiconductor element is mounted via a control terminal 101 of the semiconductor element derived from the semiconductor module 100, a first cooling member 110 that is disposed between the semiconductor module 100 and the circuit board 700 and cools the semiconductor module 100, and relay terminals 200, 200', and 200" which are connected between the control terminal 101 and the drive circuit 702. The relay terminals 200, 200', and 200" are fixed to a relay member (such as a partition wall 601) disposed between the semiconductor module 100 and the circuit board 700. This improves the assemblability and durability of the power conversion device.

The present invention is not limited to the above embodiments, and includes other forms considered within the scope of the technical ideas of the present invention as long as the features of the present invention are not degraded. In addition, the above embodiments and the plurality of modifications may be combined.

REFERENCE SIGNS LIST

100 semiconductor module
101 control terminal
101*b* cooling surface
102 AC terminal
110 first cooling member
120 second cooling member
130 spring plate member
131 leg portion
135 clip portion
140 base plate
141 attachment hole
142 positioning hole
143 first locking portion
144 second locking portion
145 control terminal opening
200, 200', 200" relay terminal
201, 201' terminal conductor
201*a* upper end portion
201*c* lower end portion
202, 202' fixing portion
202*a* flange portion
202*b* positioning portion
202*c* engagement portion
203 guide portion
203*a* guide hole
300 AC bus bar
3001 current sensor
400 smoothing capacitor
500 EMC filter
501 filter core
502 X capacitor
503 Y capacitor
600 housing
601 partition wall
602 side wall
603 arrangement hole
604 first space
605 second space
606 inlet flow path
607 outlet flow path
610 lower cover (first lid)
620 upper cover (second lid)
630 third flow path
631 flow path cover
632 cooling seat
640 fourth flow path
700 circuit board
701 control circuit
702 drive circuit
710 signal connector
1000 power conversion device
2000 battery
3000 motor
10T IGBT
10D diode

The invention claimed is:

1. A power conversion device comprising:
a semiconductor module in which a semiconductor element is sealed;
a circuit board on which a drive circuit that drives the semiconductor element via a control terminal of the semiconductor element led out from the semiconductor module is mounted; and
a first cooling member that is disposed between the semiconductor module and the circuit board and cools the semiconductor module
a relay terminal that connects the control terminal and the drive circuit,
wherein the relay terminal is fixed to a relay member disposed between the semiconductor module and the circuit board,
wherein the control terminal of the semiconductor element led out from the semiconductor module includes a plurality of control terminals,
wherein the relay terminal includes a plurality of terminal conductors corresponding to the plurality of control terminals, a fixing portion that is fixed to the relay member and integrally fixes the plurality of terminal conductors, and a guide portion that guides insertion of the plurality of control terminals of the semiconductor element.

2. The power conversion device according to claim 1, wherein the relay member serves as the first cooling member configured to cool the semiconductor module.

3. The power conversion device according to claim 1, wherein the relay member includes a partition wall disposed between the first cooling member and the circuit board.

4. The power conversion device according to claim 3, comprising:
a housing that includes the partition wall and a side wall formed around the partition wall;
a first lid that forms a first space between the first lid and the housing; and
a second lid that forms a second space between the second lid and the housing,
wherein the semiconductor module is disposed in the first space, and the circuit board is disposed in the second space.

5. The power conversion device according to claim 1, wherein the relay terminal connects the guide portion and the fixing portion by the plurality of terminal conductors.

6. The power conversion device according to claim 1, wherein a plurality of semiconductor modules, including the semiconductor module, are arranged, and the relay terminal includes a fixing portion that integrally fixes each control terminal of the semiconductor element led out from each of the plurality of semiconductor modules.

7. The power conversion device according to claim 2, comprising a second cooling member disposed on a side opposite to the first cooling member across the semiconductor module.

* * * * *